(12) United States Patent
Usami

(10) Patent No.: US 6,617,172 B2
(45) Date of Patent: Sep. 9, 2003

(54) SEMICONDUCTOR DEVICE HAVING IDENTIFICATION NUMBER, MANUFACTURING METHOD THEREOF AND ELECTRONIC DEVICE

(75) Inventor: Mitsuo Usami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/942,612

(22) Filed: Aug. 31, 2001

(65) Prior Publication Data

US 2002/0074666 A1 Jun. 20, 2002

(30) Foreign Application Priority Data

Dec. 15, 2000 (JP) .......................... 2000-381458

(51) Int. Cl.$^7$ .............................................. H01L 21/00
(52) U.S. Cl. ......................................................... 438/2
(58) Field of Search ................... 438/14, 8, 2; 430/296, 430/330; 216/84; 365/118

(56) References Cited

U.S. PATENT DOCUMENTS 4,213,192 A * 7/1980 Christensen ................. 365/118
5,837,423 A * 11/1998 Okamoto ..................... 430/296
6,428,718 B1 * 8/2002 Birdsley ........................ 216/84

* cited by examiner

*Primary Examiner*—John F. Niebling
*Assistant Examiner*—Andre C. Stevenson
(74) *Attorney, Agent, or Firm*—Antonelli, Terry, Stout & Kraus, LLP

(57) ABSTRACT

The present invention aims to economically implement an ultra-compact semiconductor device having an identification number according to the efficient utilization of an electron-beam writing method.

A memory for identifying a 128-bit identification number, which makes use of a transistor, is configured by each contact hole selectively defined by an electron-beam writing method. A plane long-side size of a semiconductor chip is set to 0.5 mm or less. The contact holes are defined simultaneously with contact holes for peripheral circuits. In addition, the plane long-side size of the semiconductor chip is set smaller than the thickness of a wafer prior to the start of its manufacture and set larger than the thickness of the post-thinning wafer. Otherwise, the same data as a barcode is further stored in the memory. Additionally, data obtained by enciphering the identification number is used to test or inspect the semiconductor chip.

21 Claims, 11 Drawing Sheets

SEMICONDUCTOR DEVICE HAVING IDENTIFICATION NUMBER, MANUFACTURING METHOD THEREOF AND ELECTRONIC DEVICE

BACKGROUND OF THE INVENTION

The present invention relates to a semiconductor device having an identification number, and particularly to a technology for economically implementing a small-sized semiconductor device mountable to various objects.

An IC card for returning information in non-contact form by radio in response to an inquiry sent from an interrogator has actively been used in recent years. A small-sized semiconductor chip (IC) having a memory, a simple logic circuit, etc. has been built in the IC card. Each of semiconductor chips each having an identification number, which is similar to such a semiconductor chip as described above and is mountable to an object desired to perform identification in non-contact form, has been brought into sight. The semiconductor chips are respectively provided with read-only memories (ROM) in which identification numbers different every chips have been written.

A technology for implementing such a ROM has been disclosed in Japanese Patent Laid-open (Kokai) No. Hei 8-139208. According to the present method, identification numbers individually different from one another are written onto a semiconductor wafer every semiconductor chips by use of an electron-beam writing technology. Described specifically, the writing of the identification numbers is carried out by the cutting off of wiring patterns produced by electron-beam writing without having to use a glass mask.

According to the method, non-cut wiring patterns are temporarily formed by a photolithography process using the conventional glass mask as fixed patterns. Subsequently, a resist film is applied onto the semiconductor wafer and post-baked. Next, an electron beam is imaged or drawn onto a cut portion of the wiring pattern. Thereafter, a developer is used to remove the corresponding pattern at the electron-beam written portion. Further, a wiring at a predetermined portion of each wiring pattern is removed by etchant or dry-etching ions. Afterwards, the resist film is removed by an asher, followed by cleaning. Thus, it was necessary to pass a complex process for implementing patterning by the cutting of the originally intended wiring pattern.

As another method of providing ROM with identification numbers different every chips written therein, a technology for determining the presence or absence of contact holes according to an exposure process of a step-and-repeat system has been disclosed in Japanese Patent Laid-open (Kokai) No. Hei 10-55939.

SUMMARY OF THE INVENTION

According to the prior art, a method of economically implementing each semiconductor chip having an identification number cannot be provided. Namely, in order to write individually different identification numbers into semiconductor chips each having an identification number on a wafer as memories, electron-beam writing is mentioned as one method. At this time, however, the prior art cannot avoid the addition of a complex process and the execution of a complex proximity effect correction. Thus, it is not possible to achieve the efficient utilization of an expensive electron-beam writing device or writer. The method of economically implementing each semiconductor chip having the identification number cannot be offered. Incidentally, the proximity effect indicates that an electron beam is diffused into a resist to change an imaged or drawn shape. However, it is necessary to perform a process or correction having made allowance for its change.

As another method for forming each identification number, the exposure process of the step-and-repeat system is known. According to the present method, however, since the presence or absence of exposure is selected according to patterns while a mask is being moved bit by bit, the number of bits for the identification number increases and a huge processing time is required together with an increase in the number of chips fabricated on a wafer, thus degrading economical efficiency significantly. Incidentally, Japanese Patent Laid-open (Kokai) No. Hei 10-55939 has made reference to the fact that electron-beam writing can be adopted in place of the step-and-repeat system. However, since the electron-beam writing is used only for the formation of each identification number in a manner similar to the step-and-repeat system, a problem arises in a manner similar to the above-described electron-beam writing.

Next, in order to get the semiconductor device having the identification number into widespread use, it is necessary to implement the following items in addition to the solution of the above-described principal problems.

An item firstly taken as an illustration is to make it possible to efficiently place a semiconductor chip on a film-shaped thin mounting base substrate. For the purpose of its implementation, it is necessary to provide a method capable of avoiding the orthogonalization of a chip's device surface to the mounting base substrate upon packaging or implementation, naturally keeping it horizontal to the mounting base substrate and economically realizing the packaging or implementation of a semiconductor device.

An item secondly taken as an illustration is to make it possible to handle a semiconductor chip having an identification number so as to coexist with a conventional barcode system. For the purpose of its implementation, it is necessary to provide a method which makes it possible to operate a barcode system with efficiency and economically apply a semiconductor device having an identification number.

An item thirdly taken as necessary is to make it possible to economically inspect a semiconductor device having an identification number without having to use a conventional expensive semiconductor tester when the semiconductor device having the identification number is inspected.

According to one aspect of the present invention, there is provided a method of manufacturing device wherein an identification number is configured by a 128-bit memory using a transistor, comprising a step for forming conductive regions which serve as components of the transistor, on the surface of a semiconductor substrate in plural form, a step for forming an insulating film over a plurality of the conductive regions, a step for selectively defining contact holes in the insulating film formed on the plurality of conductive regions by an electron-beam writing method to obtain the identification number, and a step for forming wirings connected to the conductive regions through the contact holes respectively.

According to another aspect of the present invention, there is provided a method of manufacturing a semiconductor device wherein an identification number is identified by a memory using a plurality of transistors, comprising a step for forming source and drain regions of a plurality of the transistors on the surface of a semiconductor substrate, a step for forming an insulating film so as to cover a plurality of the source and drain regions, a step for defining contact holes whose presence or absence are selected according to '1' and '0' stored in the memory, in the insulating film on the transistors by using an electron-beam writing method, a step for forming a wiring layer on the insulating film having the contact holes, and a step for thereafter forming a coil for the reception of a microwave on the semiconductor substrate.

According to a further aspect of the present invention, there is provided a semiconductor device wherein an identification number is configured by a 128-bit memory using a plurality of transistors, comprising source and drain regions of a plurality of the transistors, which are provided on the surface of a semiconductor substrate, an insulating film provided so as to cover a plurality of the source and drain regions, contact holes whose presence or absence are selected according to '1' and '0' stored in the memory, the contact holes being defined in the insulating film on the transistors, a wiring layer provided on the insulating film having the contact holes defined therein, and a microwave receiving coil formed on the semiconductor substrate with the wiring layer provided thereon.

According to a still further aspect of the present invention, there is provided a method of manufacturing a semiconductor device, comprising a step for preparing a semiconductor substrate, a step for forming the semiconductor device inside a chip area which corresponds to the surface of the semiconductor substrate and whose plane long-side size is smaller than the thickness of the semiconductor substrate, a step for removing the semiconductor substrate from the back side until the thickness of the semiconductor substrate becomes thinner than the plane long-side size of the chip area, and a step for separating the semiconductor device in chip form.

According to a still further aspect of the present invention, there is provided an electronic device comprising a semiconductor device wherein an identification number is identified by a memory using a transistor, and a barcode, the semiconductor device including conductive regions which serve as components of the transistor, an insulating film formed so as to cover a plurality of the conductive regions, contact holes selectively defined in the insulating film on the plurality of conductive regions to obtain the identification number, wirings connected to the conductive regions through the contact holes, and a microwave receiving coil formed on a semiconductor substrate provided with a wiring layer, wherein the memory has an area for storing the same data as the barcode in addition to an area for storing the identification number.

According to a still further aspect of the present invention, there is provided a semiconductor device wherein an identification number is configured by a first memory through the use of a transistor, comprising conductive regions which serve as components of the transistor, an insulating film formed so as to cover a plurality of the conductive regions, contact holes selectively defined in the insulating film on the plurality of conductive regions to obtain the identification number, wirings connected to the conductive regions through the contact holes, a microwave receiving coil provided on the wirings, a resonance circuit including a capacitor and the microwave receiving coil, and a second memory for storing an encrypted code obtained by enciphering the identification number.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Semiconductor devices according to the present invention, each having a recognition or identification number, manufacturing methods thereof, and electronic devices will hereinafter be described in further detail by reference to several embodiments of the invention illustrated in the accompanying drawings.

Figure 1:
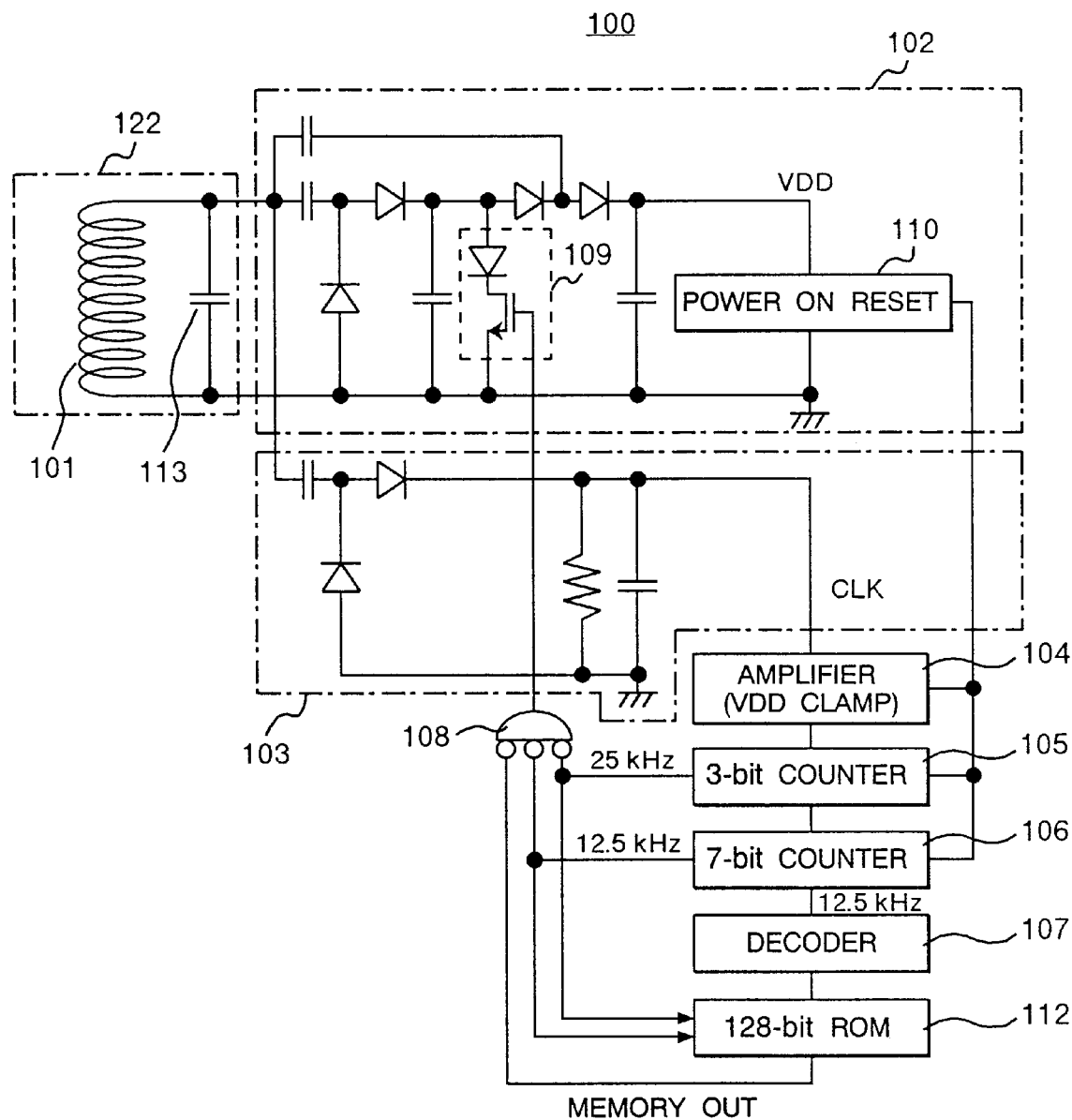
FIG. 1 is a circuit configuration diagram for describing a first embodiment of a semiconductor device according to the present invention.

FIG. 1 shows a circuit employed in a first embodiment of the present invention. A microminiaturizable circuit configuration is adopted for a semiconductor device of the present invention, having an identification number. Various circuit configurations are adopted according to purposes.

The circuit show in FIG. 1 is an example illustrative of a transmitting and receiving circuit for communicating with a remote interrogator through the use of a microwave. A circuit 100 for a semiconductor device (semiconductor chip) having an identification number comprises a coil (antenna coil) 101, which constitutes a resonance circuit 122 together with a capacitor 113, a power circuit 102 having a power on reset circuit 110, which doubles and rectifies a microwave signal received by the coil 101 and sent from the interrogator (not shown) to produce or obtain a source voltage VDD and which outputs the source voltage VDD when it is brought to a suitable voltage, a modulator 109 for modulating the received microwave signal, a demodulator circuit or demodulator 103 for demodulating the amplitude-modulated microwave signal to take out a clock signal CLK, an amplifier (VDD clamp) 104 for amplifying a clock signal CLK, a 3-bit counter 105 for frequency-dividing the clock signal CLK to thereby produce a 25-kHz clock signal, a 7-bit counter 106 for further dividing the clock signal to thereby produce a 12.5 kHz clock signal, a read-only memory 112 having the identification number written therein, which will be described later, a decode circuit (decoder) 107 for reading the contents of the memory 112 bit by bit, and a gate circuit 108 for outputting a memory OUT corresponding to the output of the memory 112 with a predetermined timing. The modulator 109 modulates the microwave signal in response to the memory OUT corresponding to the output of the gate circuit 108. Incidentally, individual circuits, which respectively constitute logic circuits such as the counter 105, etc., are respectively implemented by CMOS logic circuits comprised of combinations of NMOS and CMOS transistors.

The coil 101 is on-chip formed on a semiconductor chip 111. Owing to it, economical efficiency can be obtained. Incidentally, the coil is not limited to it but may be configured as an external coil. A radiating antenna may be installed to transmit the contents of the read-only memory 112 by means of radiation energy.

When it is desired to externally provide the coil, an external antenna is formed around a card-shaped mounting base substrate, for example and the semiconductor chip 111 is placed on the mounting base substrate, whereby an electronic device, typically, an IC card can be configured.

The identification number placed on the read-only memory 112 comprises a plurality of memory bits. In the present embodiment, 128 bits have been adopted therefor. If the 128 bits are given, it is then possible to obtain the combinations of 2 to the 128th power. The number of bits referred to above can freely be designed according to the field of application and can also be varied structurally.

As methods of writing the identification number into the memory, may be mentioned, a laser-based method, a fuse cutting-out method, a wire short circuiting method, etc. However, a more efficient method is required to need a write area, a peripheral circuit, makes a write time long, and economically form a semiconductor chip having an identification number. In order to write individually-different identification numbers into their corresponding semiconductor chips on a wafer (semiconductor substrate) in particular, the point is that an electron-beam writing technology is utilized. The circuit for the semiconductor chip having the identification number, according to the present invention is implemented by using the electron-beam writing technology.

Figure 2:
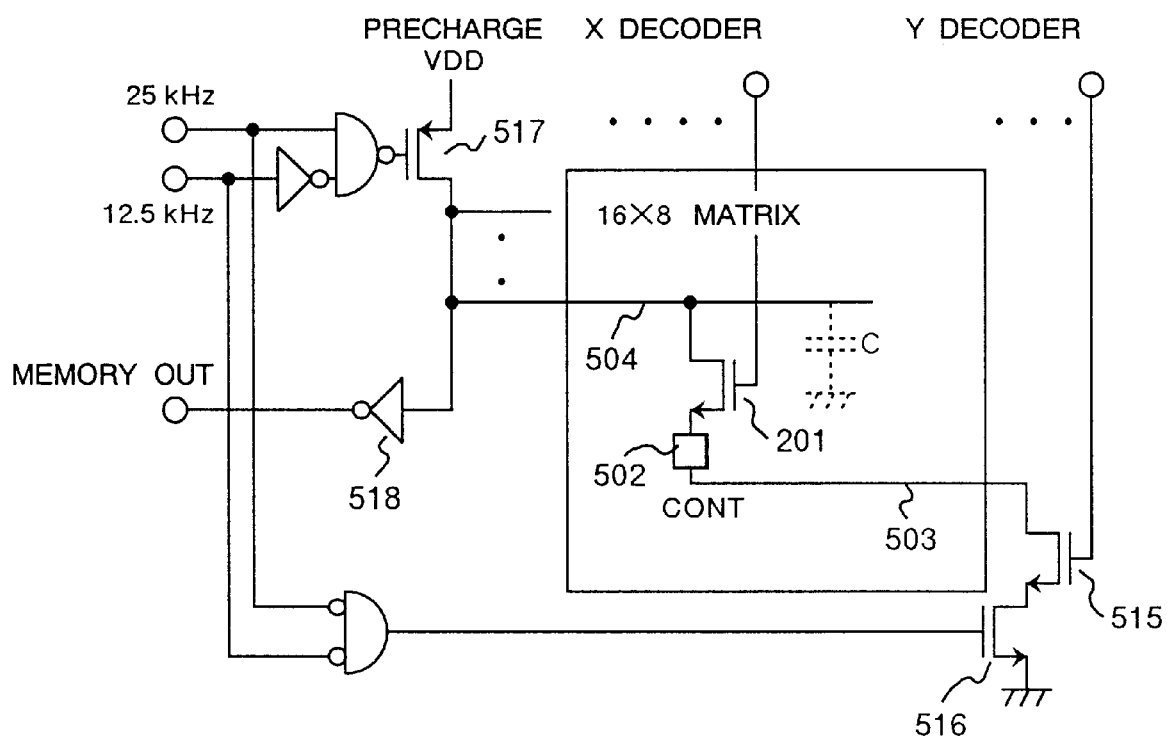
FIG. 2 is a circuit diagram for describing a memory employed in the first embodiment.

FIG. 2 shows an example of a circuit configuration of the read-only memory 112 fabricated by the electron-beam writing technology. An NMOS transistor 201 is used to hold data equivalent to one bit of the memory. A contact hole 502 is used so as to exist when the memory is given '1' and so as to be regarded as absent when the memory is given '0'. Incidentally, the correspondence of the presence or absence of the contact hole to '1' or '0' may be vice versa. A source wiring 503 is a wiring for connecting in common, sources of plural NMOS transistors for data retention, each of which is identical to the transistor 201. A drain wiring 504 is a wiring for commonly connecting drains of NMOS transistors for data retention other than the transistor 201. Incidentally, the NMOS transistors for the data retention, which are other than the transistor 201, are not illustrated but arranged as 128 in the form of a 16 by 8 matrix.

When the contact hole 502 provided at the source of the NMOS transistor 201 exists, the source thereof is connected to the source wiring 503. When the source wiring is selected by a Y decoder included in the decoder 107, it is brought to a ground level via transistors 515 and 516 (drain wiring circuit). Thus, when the gate of the NMOS transistor 201 goes high in level according to the selection thereof by an X decoder included in the decoder 107, the NMOS transistor 201 is turned on to allow a current to flow, so that an electrical charge stored in a stray capacitance C of the drain wiring 504 in advance is discharged. Incidentally, a precharge circuit 517 carries out the temporary charging of the stray capacitance C of the drain wiring 504.

While a memory OUT is outputted from an inverter 518 connected to the drain wiring 504, its output level is determined according to the level of the drain wiring 504. If the contact hole for the NMOS transistor 201 exists, then the electrical charge of the drain wiring 504 escapes to the ground. Therefore, the memory OUT is inverted by the inverter 518, which indicates a high level, i.e., it indicates that the contents of the memory is '1'. If the contact hole for the NMOS transistor 201 is absent, then the electrical charge of the drain wiring 504 does not escape, and the drain wiring 504 remains at the high level. Thus, it is inverted by the inverter 518 and outputted therefrom. Namely, the memory OUT output is brought to a low level, which indicates that the contents of the memory is '0'.

Figure 3:
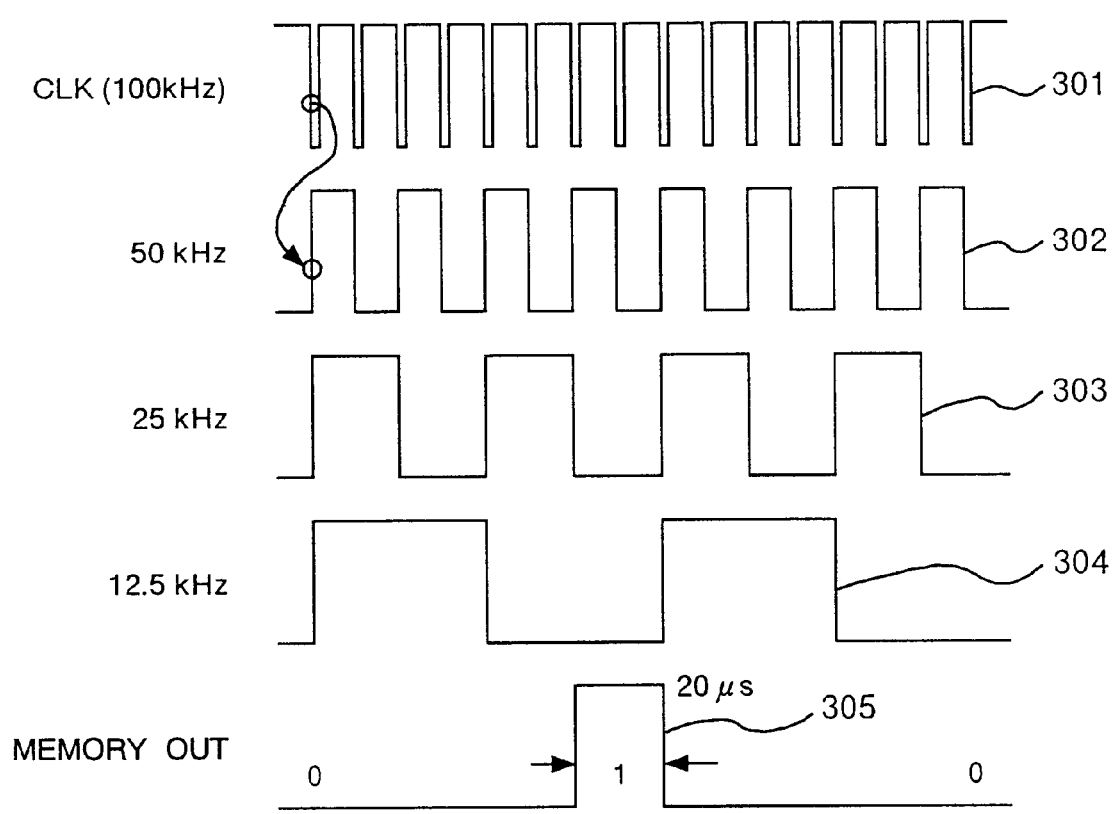
FIG. 3 is a waveform chart for describing operating waveforms of a circuit according to the first embodiment.

Now, FIG. 3 shows an example illustrative of waveforms of signals for driving the read-only memory 112. A first waveform 301 indicates a clock signal CLK of 100 kHz in the present embodiment. A second waveform 302 indicates a waveform of 50 kHz obtained by bringing the frequency of the first waveform down into half (frequency-dividing it into half). A third waveform 303 indicates a waveform of 25 kHz obtained by bringing the frequency of the second waveform down into half by the counter 105. A fourth waveform 304 indicates a waveform of 12.5 kHz obtained by bringing the frequency of the third waveform down into half by the counter 106. A fifth waveform 305 shows a waveform indicative of timing for the memory OUT having passed through the gate circuit 108 shown in FIG. 1. A pulse width of the memory OUT corresponds to 20 microseconds in the present embodiment.

The above-described respective waveforms respectively indicate examples obtained when the circuits according to the embodiment of the present invention, which are shown in FIGS. 1 and 2 are in operation. Namely, the clock signal CLK (100 kHz in this case) demodulated by the demodulator 103 is sequentially counted down and finally frequency-reduced up to 12.5 kHz. At this time, the counted-down signals in the course of above process, i.e., the second and fourth signals are effectively processed and used for the precharge circuit 517, gate circuit 108 (memory output circuit), etc. provided on the periphery of the memory 112.

While the output is determined according to the rising edges or falling edges of the respective waveforms under the configurations of the counter circuits, the output is to be determined according to the falling edges in the present embodiment shown in FIG. 3. This is done to perform switching between the signals when energy received through the microwave is highest.

Such a battery-free semiconductor chip as shown in the present embodiment depends on microwave energy supplied from outside. When the clock signal is high in level, i.e., the last, i.e., signal having obtained the microwave energy falls, the energy that the semiconductor chip has obtained, reaches the peak. On the other hand, each of the CMOS logic circuits will use up or consume energy from its nature due to a through current or the like when it is mainly during the rising or falling operation, whereas the CMOS logic circuit has almost no energy consumption during another time in which the level of the signal is held. Accordingly, if the point that the high level of the signal continues and the energy reaches the peak, is regarded as the time of the falling operation of the CMOS logic circuit, then the circuit is stably operated.

Figure 4:
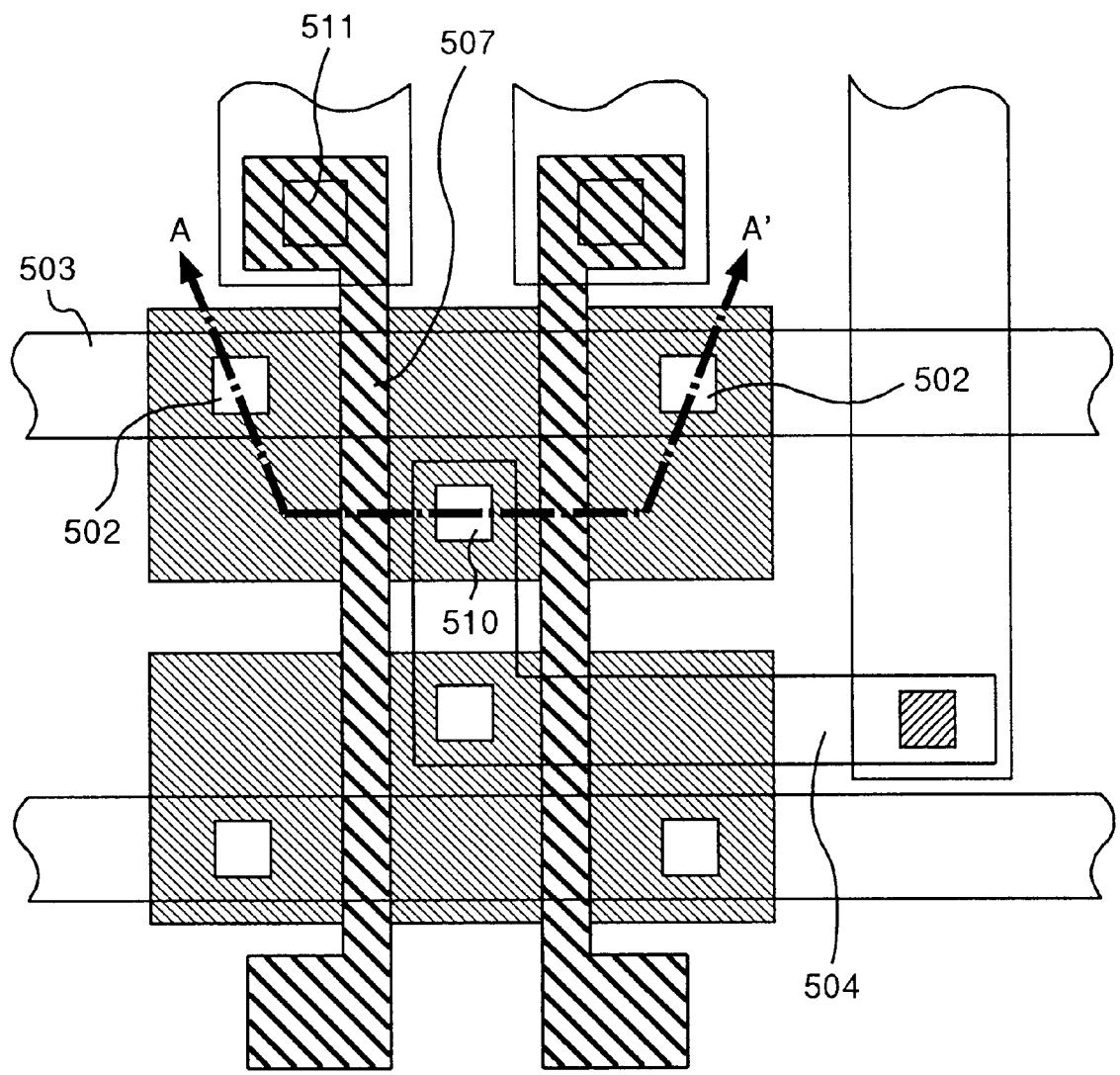
FIG. 4 is a plan view for describing the structure of the memory employed in the first embodiment.

FIG. 4 shows a plan view illustrative of an example of the read-only memory 112 on the chip. A contact hole 502 is used to connect the source terminal of the NMOS transistor 201 and the source wiring 503. A drain terminal of the transistor 201 is connected to the drain wiring 504. Reference numeral 507 indicates a gate wiring of the transistor 201.

In FIG. 4, the NMOS transistor 201 shown in FIG. 2 and three transistors that surround it, are shown in the form of a layout. The transistor 201 is placed in an upper-left half in the drawing, and other transistors are respectively disposed in upper-right, lower-left and lower-right halves. Further, contact holes are respectively defined therein.

The contact holes 502 are located inside the source wiring 503 and defined in the form of squares. In the layout of FIG. 4, drain regions for the transistor 201 and the transistor disposed in the upper-right half are in common. When the contents of the memory is given as '1', the contact holes are disposed, whereas when the contents of the memory is given as '0', no contact holes are disposed.

The contact holes are defined by an electron-beam direct writing technology. The contact holes are fixed in shape rather than in wiring and are wider in interval or spacing than the wiring. Such contact holes can be imaged or drawn together with contact holes other than the contact holes for representing the contents of the memory, i.e., contact holes 510 used for a drain region connection, contact holes 511 for a gate electrode connection, contact holes (not shown) for peripheral circuits (drain wiring circuit, precharge circuit, etc.), etc. all of which are shown in FIG. 4. Each contact hole at this time is lower than the wiring in imaging density and broader than the wiring in interval or spacing. This holds superiority in the application of the electron-beam direct writing technology to the contact holes.

Namely, this shows that identification numbers can be imaged or drawn without performing a complex electron-beam proximity effect correction every chips. When the electron-beam writing technology is applied to each wiring, narrow wiring intervals or spacing are formed in large numbers and irregularly, and hence a complex proximity effect correction is carried out for each chip. Therefore, computer-based processes and the amount of data increase, and much imaging times are required, thereby causing a reduction in imaging efficiency.

While a description has been made of the case in which the contact holes are used, an effect similar to the above is obtained even in the case of through holes for connecting between wirings. Therefore, if a system is taken wherein the way of designing is set in form unified through the use of through holes and the contents of the memory is represented in the presence or absence of each through hole, then a similar improvement in electron-beam writing efficiency can be expected. This is because both the through holes and contact holes are respectively square in a form smaller than the wiring and low in pattern density, and are broader than the wiring in spacing.

Figure 5:
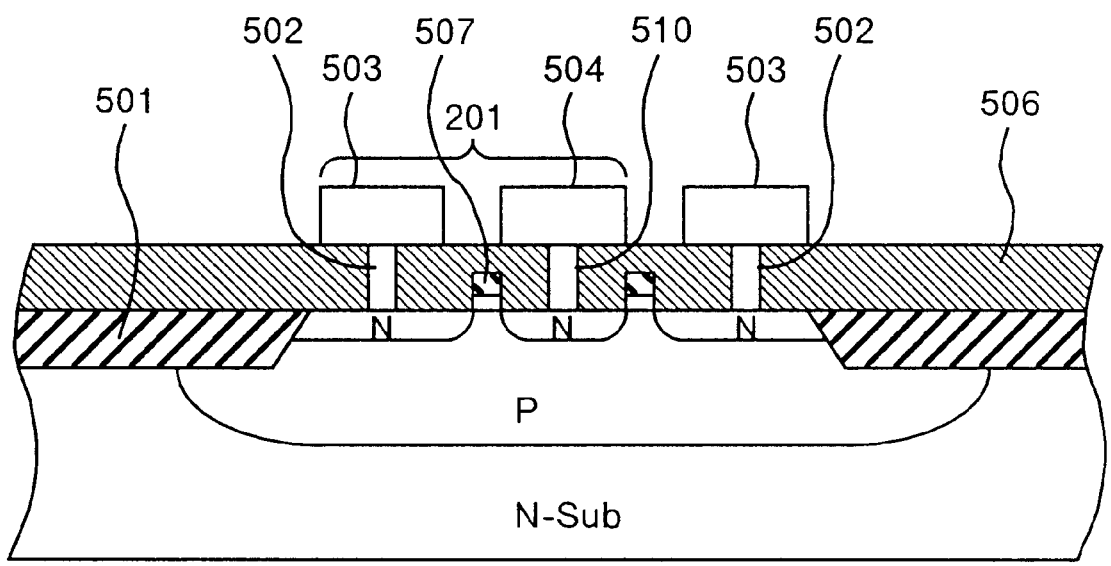
FIG. 5 is a cross-sectional view for describing the structure of the memory employed in the first embodiment.

FIG. 5 shows a device cross-sectional view of a semiconductor chip, which is taken along line A–A' of FIG. 4. An element isolation film 501 and an oxide film 506 are formed to isolate transistor elements and wirings from one another. Contact holes 502 are used to connect a source region of an NMOS transistor 201 and a source wiring 503. Forming a P-type well in an N-type silicon semiconductor substrate (N-Sub) and effecting N-type diffusions for source and drain regions on the P-type well forms the present MMOS transistor device. Thus, conductive regions, which serve as the components of the transistor, are formed on the surface of the semiconductor substrate. A gate 507 of the transistor 201 is formed between the source and drain and is used to control the turning on and off of the NMOS transistor.

In order to form the contact holes by means of electron-beam direct writing, the oxide film 506 is formed over the entire surface of the wafer, followed by application of an electron-beam writing resist thereto. Further, predetermined contact holes are drawn or imaged at portions each corresponding to '1' indicative of the contents of each bit in a memory, and an imaging process for simultaneously defining contact holes for forming a peripheral or memory circuit is carried out. Therefore, data on the wafer, about the contact hole for the identification number and the contact hole for the peripheral circuit are provided for a computer program in a control circuit for controlling the intensity and position of an electron beam emitted from an electron-beam writing device.

Upon electron-beam writing, a positive type is used as the resist and a portion irradiated with an electron beam is dissolved by a developer. The developer allows a hole to be defined in the resist which is to define the corresponding contact hole. Thereafter, dry etching is performed with the resist as a mask, whereby the oxide film at predetermined positions is etched to thereby make it possible to define the corresponding contact holes.

Thereafter, a wiring material is grown on the whole surface of the wafer, followed by hot etching, whereby wiring patterns can be formed.

While a description has been made above, of the contact holes, a process similar to the above can be adopted for through holes provided between wirings. Namely, electron-beam writing is carried out to allow the formation of the through holes in predetermined positions according to recognition or identification numbers. For example, the wiring 503 shown in FIG. 5 is changed to a source wiring dedicated for the transistor 201, and a new insulating layer is formed on the surface including the source wiring. An electron-beam writing method is applied to the new insulating film to selectively define through holes. Further, a new wiring connected to the source wiring via the corresponding through hole is formed on the new insulating film, whereby a memory can be formed by using the through holes.

Figure 6:
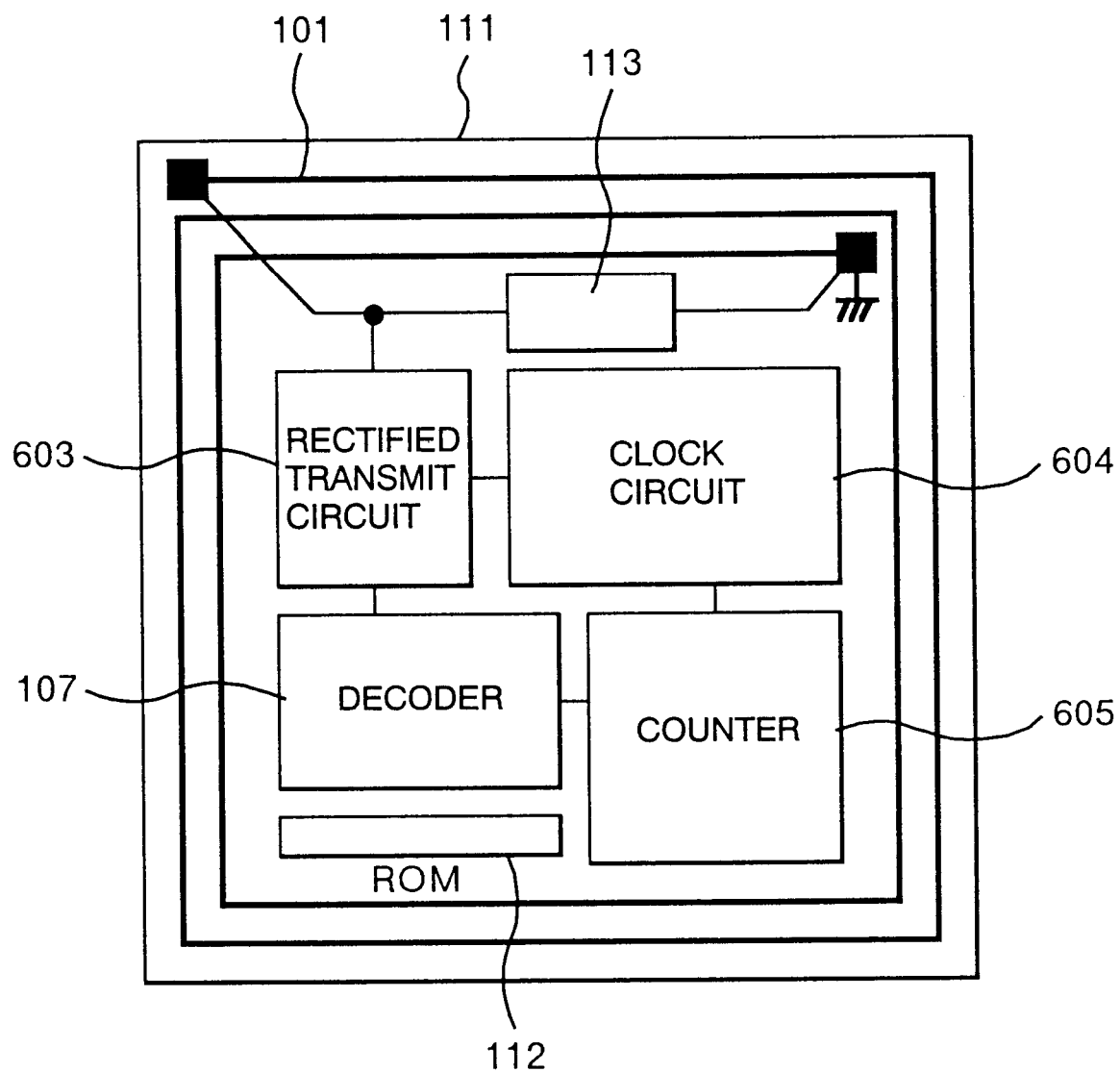
FIG. 6 is a configuration diagram for describing a semiconductor chip according to the first embodiment of the present invention.

FIG. 6 shows an example illustrative of an internal configuration of the semiconductor chip 111 having the identification number, which has been up to now. A capacitor 113 and a coil 101 constitute a resonance circuit 122. A read-only memory 112 having plural bits, which is formed in the semiconductor chip 111, is operated by a rectified transmission circuit 603 having a power circuit 102 and a modulator 109, a clock circuit 604 having a demodulator 103 and an amplifier 104, a decoder 107, and a counter 605 based on counters 105 and 106 and sends out a signal indicative of the identification number.

The coil 101 is on-chip formed. Further, the coil 101 is formed of a wiring material such as aluminum, copper or the like after the completion of device elements under the use of a semiconductor wiring process. In order to improve the Q factor of the coil, a plurality of multilayer interconnection layers are connected in tandem so as to reduce wiring resistances. Using a wiring layer make it possible to form a satisfactory capacitor free of a restraint on its polarity as the capacitor 113.

As to the semiconductor chip having the identification number, according to the present invention, the smaller the size of the chip, the more it becomes economically effective as will be described later. Further, the more the chip is reduced in size even in terms of a mechanical strength, the more it is hard to experience a mechanical shock. Accordingly, the chip is hard to cause cracks or damage and capable of holding its strength. Thus, the semiconductor chip ultra small in size and having the identification number has a new value in terms of economical efficiency and reliability. Further, since the read-only memory (ROM) provided inside the chip is formed by the electron-beam writing technology, different identification numbers can all be formed over the whole surface of the wafer economically and in small sizes. Devices used in semiconductor chips having the identification numbers are not limited to silicon CMOS. They may be other materials such as a gallium arsenide compound, etc. or device structures. No limitations are imposed thereon.

Figure 7A:
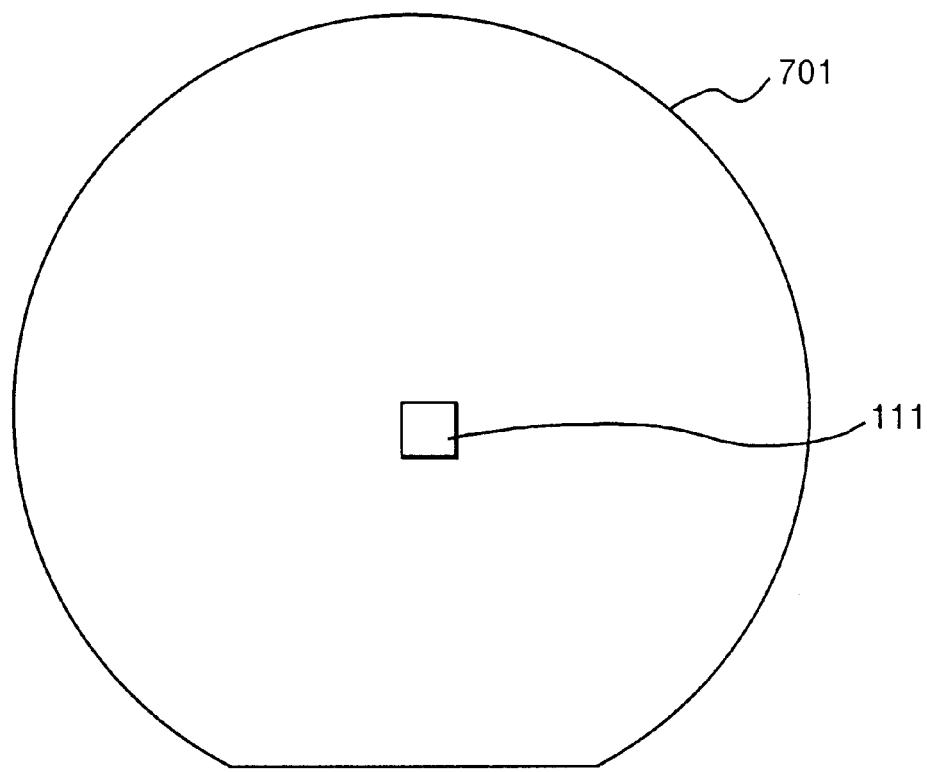
FIGS. 7($a$), 7($b$) are diagrams for describing the semiconductor chip separated from a wafer, according to the first embodiment of the present invention.

FIGS. 7(a), (b) show the semiconductor chip 111 having the identification number, according to the present embodiment, which has been separated from a wafer. A standard thickness type wafer 701 is a wafer (semiconductor substrate) placed under a semiconductor manufacturing process in order to form devices and wirings for a semiconductor. The present wafer is one wherein the standard for its thickness is determined industrially. The semiconductor chip 111 is formed in the semiconductor wafer 701 and finally separated by dicing or etching. FIG. 7(a) is a plan view of the semiconductor chip and FIG. 7(b) is a cross-sectional view thereof, respectively.

Figure 7B:
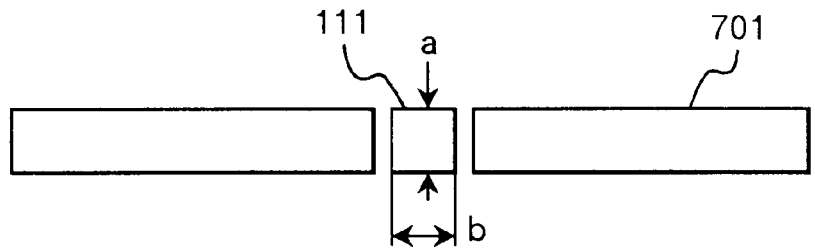

In FIG. 7(b), symbol a indicates the thickness of the semiconductor chip 111, and symbol b indicates the length (planar long-side size) of a side long as viewed in the plane size of the semiconductor chip 111. The semiconductor chip having the identification number can bring about an economical effect as it becomes small in size. If devices, processes and the number of masks to be used are of the same, then the standard cost has already been determined as the cost required to complete a sheet of semiconductor wafer. Accordingly, the more the number of semiconductor chips obtainable from one wafer increases, the more the cost of one semiconductor chip decreases. Further, the more the size of each semiconductor chip becomes small, the more its yield enhances.

To this end, the length b of the side needs to take a small size. The standard for the present invention resides in that the length b of the side is smaller than the chip thickness a, i.e., the initial thickness of the semiconductor wafer per se. Described specifically, the present embodiment adopts a length less than or equal to 0.5 mm as the length b of the side.

According to the present embodiment, an expensive electron-beam writing device can efficiently be utilized. It is also possible to provide a method of economically implementing a semiconductor chip having an identification number. Further, a semiconductor chip ultra small in size and having an identification number, which is low in cost and has a mechanical strength, can be provided.

Figure 8A:
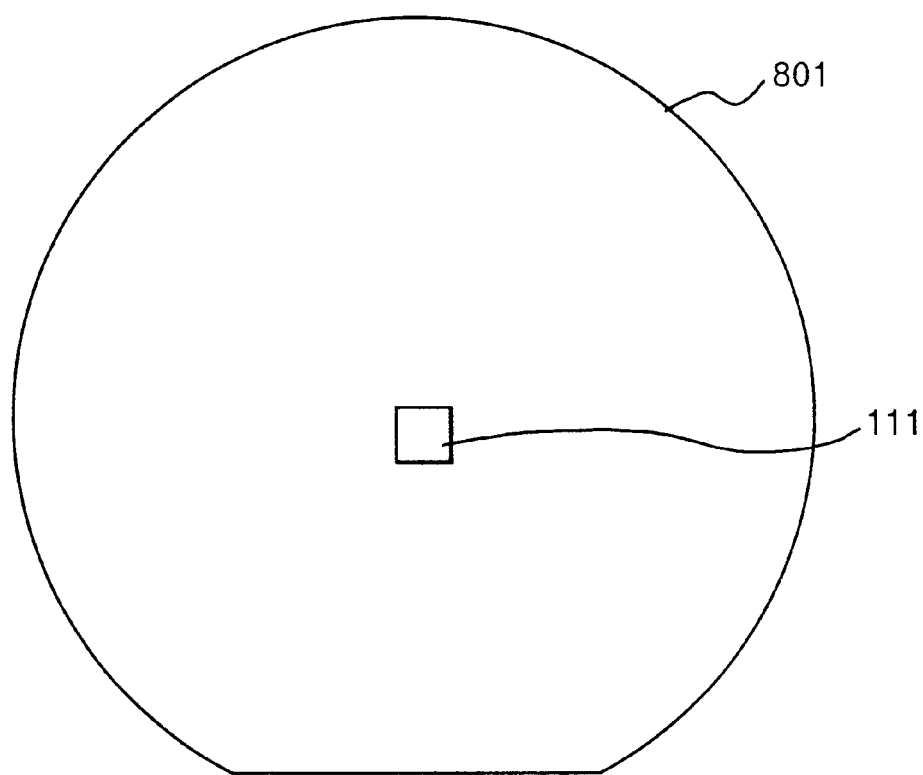
FIGS. 8($a$), 8($b$) are diagrams for describing a second embodiment of the present invention.
Figure 8B:
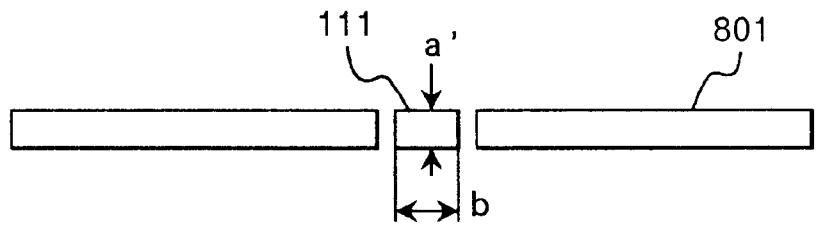

FIGS. 8(a), 8(b) show a second embodiment of the present invention. A thin form is adopted for a semiconductor chip 111 having an identification number, according to the present embodiment. FIG. 8(a) is a plan view thereof and FIG. 8(b) is a cross-sectional view thereof, respectively. A wafer 801 is different from the wafer placed in the state of being during such a semiconductor process step as shown in FIG. 7(a). It indicates a wafer placed in a state in which the process is completed and the wafer referred to above is thinned by backgrinding or spin etching.

The semiconductor chip 111 having the identification number is placed within the wafer 801. The semiconductor chip 111 is separated in a chip size by dicing or dry etching. Symbol a' in FIG. 8(b) indicates the thickness of the semiconductor chip 111, which is equal to the thickness of the wafer 801. Further, symbol b in FIG. 8(b) indicates the length of a long side as viewed in quadrangular plane sizes of the semiconductor chip 111 in a manner similar to FIG. 7(b). When the semiconductor chip 111 having the identification number is dropped on or attached onto paper for implementation, an applied extensive characteristic is brought about and an added value increases as the thickness becomes thin. Therefore, the thinner the thickness a', the better. While the more a side length b becomes small, the more economical efficiency is excellent, there is a limit depending on the scale down of a semiconductor and a circuit scale. On the other hand, the thickness a' and the side length b need to have a relationship in which the side length b is larger than the thickness a' as will be described below by reference to FIGS. 9(a), 9(b) for the purpose of the above implementation. In the present embodiment, the side length b is set to less than or equal to 0.5 mm and the thickness a' is set to less than or equal to 0.06 mm.

While the semiconductor wafer also varies in standard thickness when it varies in size, it does not exceed a thickness of 1 mm. On the other hand, the size of the semiconductor chip having the identification number can be reduced owing to an improvement in circuit system, an improvement in application process, and an increase in the number of multilayer interconnection layers. Fabricating a chip whose side length is larger than the thickness of a standard semiconductor wafer is not effective economically.

According to the present embodiment, the efficient and economical packing of the semiconductor device having the identification number can be realized.

Figure 9A:
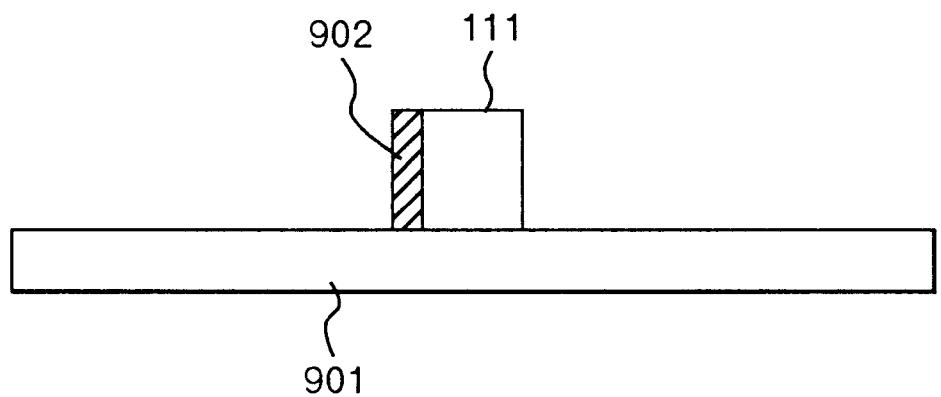
FIGS. 9($a$), 9($b$) are diagrams for describing a third embodiment of the present invention.
Figure 9B:
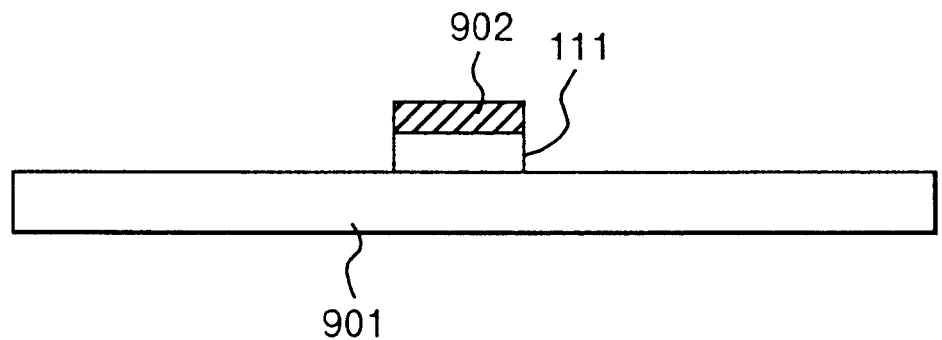

FIGS. 9(a), 9(b) show a third embodiment of the present invention. In the present embodiment, semiconductor chips 111 each having an identification number are implemented on film-shaped mounting base substrates 901 respectively. FIG. 9(a) shows a case whose side length b is smaller than a thickness a' thereof, and FIG. 9(b) shows a case in which a case whose side length b is larger than a thickness a' thereof, respectively. The mounting base substrate 901 is a film-like medium and includes a paper sheet, a plastic sheet or the like, for example. A device surface 902 on which a transistor and a wiring layer exist, is provided on the surface of each of the semiconductor chips 111. An on-chip coil, and terminals for connection of an external antenna called a radiating antenna exist on the surface of each semiconductor chip 111.

In FIG. 9(a), the device surface 902 is orthogonal to the mounting base substrate 901. Since the semiconductor chip 111 is shaped in the form of a dice, the probability that the semiconductor chip 111 will be implemented in such a way, is high. On the other hand, the device surface 902 is parallel with the mounting base substrate 901 in FIG. 9(b). Since the semiconductor chip 111 is shaped in plate form, the probability that the semiconductor chip 111 will be implemented in such a way, is high. The possibility that the device surface 902 will be orthogonal to the mounting base substrate 901, is very low.

When the device surfaces are respectively vertically placed on the film-shaped thin mounting base substrates, the reading of data from the semiconductor chips each having the identification number might not be performed properly depending on the directivity of the antenna. Since the semiconductor chips each having the identification number are separated one by one and placed in dispersed form upon mounting the device surfaces on the film-shaped thin mounting base substrates, it is desirable to naturally place the device surfaces on the mounting base substrates with their upper surfaces or lower surfaces turned upward or downward.

Therefore, when the semiconductor chip having the identification number is implemented on the film-shaped thin mounting base substrate, the thickness of the semiconductor chip 111 having the identification number and its plane size are associated with each other so as to take such a chip form as shown in FIG. 9(b). In other words, the plane long-side size b of the semiconductor chip 111 having the identification number is set so as to be larger than the thickness of a wafer background to take out the semiconductor chip 111, i.e., the thickness a'.

When the plane long-side size b is set to 0.5 mm or less, for example, the semiconductor chip 111 is rendered ultra small in size, and the mounting base substrate 901 with the same chip placed thereon can freely be applied onto objects of various shapes, such as a case or box, a bag, a tube, etc. Thus, the mounting base substrate 901 is applied to a case with wrapped food, and the type of product, the date of manufacture, the use-by date, a manufacturing company, etc. are entered as an identification number, whereby a conventionally-uncreated system for managing food placed in a home refrigerator can be implemented. Namely, a system can be implemented which catches an identification number (information) for the food placed in the refrigerator by means of non-contact to thereby notify oncoming of the use-by date to the outside.

Figure 10:
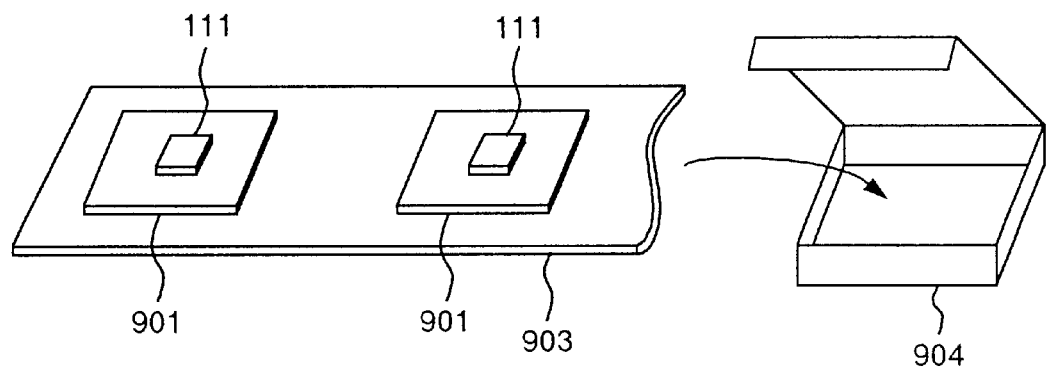
FIG. 10 is a diagram for describing the packaging of a semiconductor chip according to the third embodiment of the present invention.

In such an example, a large number of mounting base substrates 901 are used on the manufacturer side. In order to provide convenience for such a use, a method of manufacturing a semiconductor device is provided wherein mounting base substrates 901 with semiconductor chips 111 placed thereon are bonded to a longer tape 903, and the tape 903 is folded and accommodated in an inlet (storage case) 904 as shown in FIG. 10 by way of example. The large number of semiconductor chips 111 are shipmented to the manufacturer in a state of being held in the inlet 904.

Incidentally, the identification numbers are made different from one another every manufacturing dates, for example, without setting them individually in several upon such a use. It is needless to say that while the identification numbers are made different every individual semiconductor chips in the description made up to now, the above electron-beam writing method is capable of making them different every predetermined amounts.

According to the present embodiment, the semiconductor chip can efficiently be placed on the film-shaped thin mounting base substrate.

Figure 11:
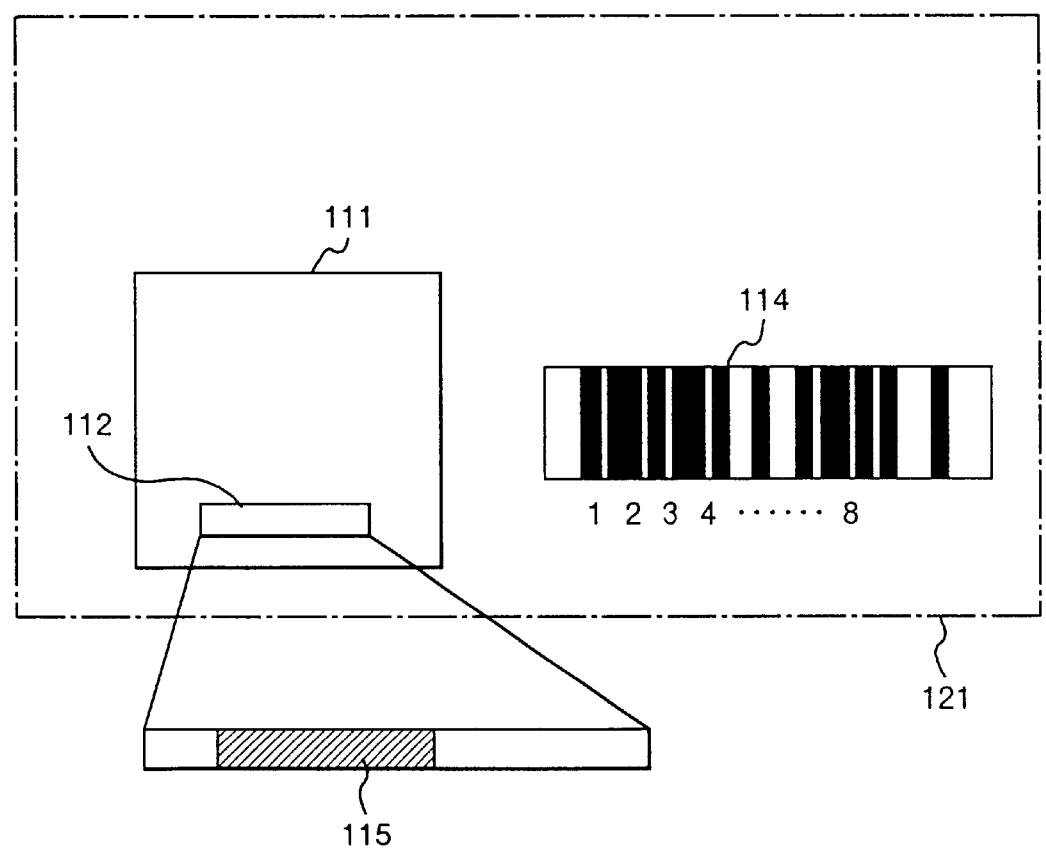
FIG. 11 is a diagram for describing a fourth embodiment of the present invention.

FIG. 11 shows a fourth embodiment of the present invention. In the present embodiment, a semiconductor chip 111 having an identification number is used coexistently with a barcode. The barcode 114 coexists adjacently to the semiconductor chip 111 or on an upper or lower surface thereof. In FIG. 11, the barcode 114 is printed on a slip-of-paper-like sheet, the semiconductor chip 111 is placed in the left-hand neighborhood of the barcode 114, and an electronic device 121 is configured as a whole.

In the present embodiment, a barcode area 115 for storing the same data as the barcode 114 is provided at part of a read-only memory 112 for storing the identification number. Alternatively, a write type memory is placed in the semiconductor chip 111, and the barcode area 115 may be provided in the write type memory.

The standardization of the barcode has been in progress and the field of its application is diversified. However, since an optical technology is applied thereto, the directivity thereof is strong and its recognition rate is not necessarily excellent. Therefore, a method of supplementing the weak point of the barcode system according to the combined use of the semiconductor chip having the barcode, according to the present invention to thereby improve a recognition rate is effective.

If at this time, a method of assigning the same code as the barcode 114 to the part 115 of the memory 112 lying within the semiconductor chip 111 having the plural bits as described above is adopted, then data read from the semiconductor chip having the identification number may not be converted to another. It can share the use of a data base of the barcode system and hence brings about a great merit in developing and operating the system, thus making it possible to contribute to economical realization of the system-using the semiconductor chip having the identification number.

The barcode area 115 lying within the memory 112 of the semiconductor chip 111 falls within part of the whole memory area 112, and this part is excluded from an encryption range, whereby it can enjoy the same simplicity as the conventional barcode. If the barcode area 115 is regarded as an area to be encrypted in reverse, then it can be effectively operated from the viewpoint of security.

Increasing the capacity of the memory 112 of the semiconductor chip 111 as compared with that of the barcode 114 makes it possible to cause the semiconductor chip 111 to have information much larger than that of the barcode 114, thus allowing an increase in practicability of the system.

According to the present embodiment, the barcode system can efficiently be operated, and the economical application of the semiconductor device having the identification number can be realized.

Figure 12:
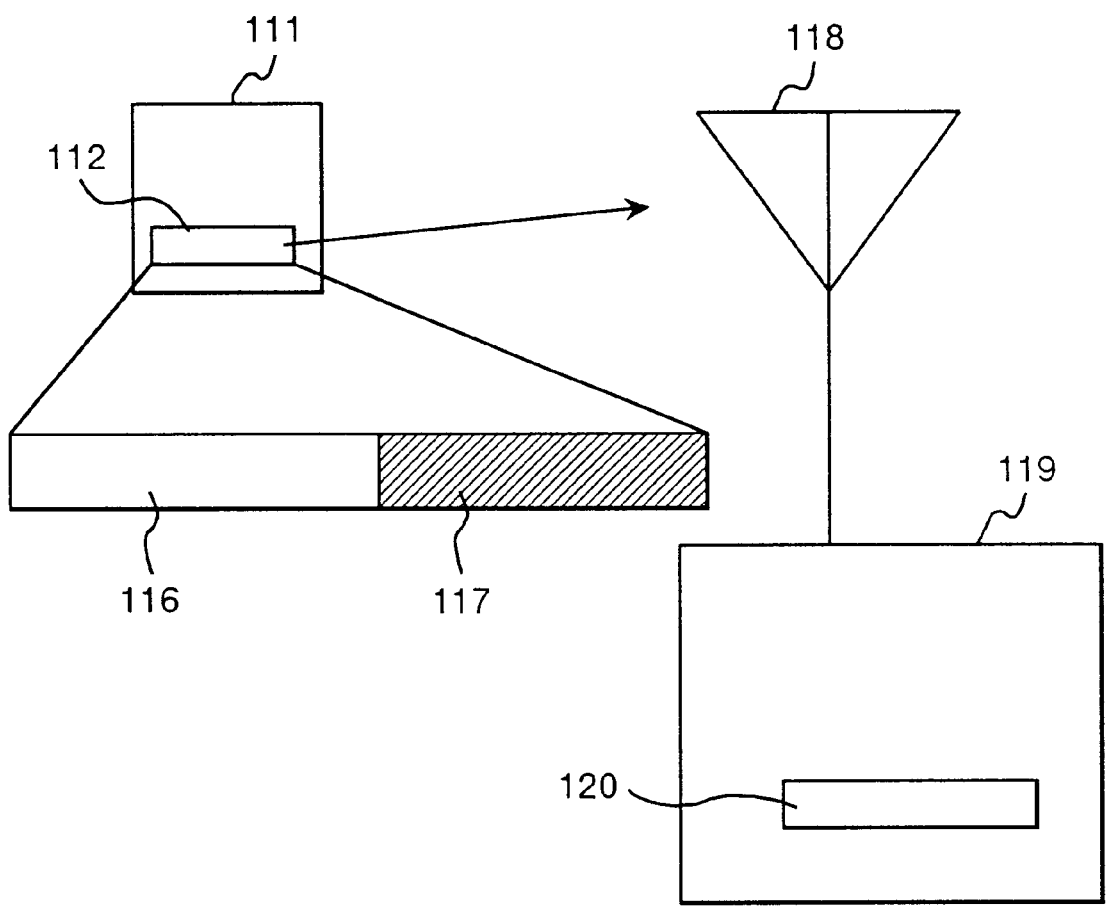
FIG. 12 is a diagram for describing a fifth embodiment of the present invention.

FIG. 12 shows a fifth embodiment of the present invention. In the present embodiment, an encrypted code 117 obtained by enciphering an identification number 116 is stored in a memory 112 of a semiconductor chip 111 having an identification number. A production inspection of the chip 111 is carried out by use of the encrypted code 117 and the identification number 116. Such an inspection is executed by means of a personal computer 119.

The personal computer 119 includes an antenna 118 attached thereto and has, thereinside, a key code 120 stored in a memory, for enciphering an identification number. Upon inspection, the semiconductor chip 111 to be inspected or tested is placed in the vicinity of the antenna 118, and the personal computer 119 reads out the identification number 116 and the encrypted code 117 from the semiconductor chip 111.

The conventional semiconductor chip inspection has been performed by generating a predetermined test pattern from a semiconductor tester, giving it to a semiconductor chip to be inspected, and continuously checking a corresponding output pattern taken out from the semiconductor chip against a predetermined pattern included in the semiconductor tester, thereby determining whether or not the semiconductor chip is non-defective. This inspection is intended for semiconductor chips having the same spec. and is performed according to the same procedure.

On the other hand, since the semiconductor chips each having the identification number have individually-different identification numbers respectively, the inspections are individually different from one another. Therefore, the semiconductor tester must be provided with different large quantities of identification number data and hence becomes a large economical burden.

The present invention provides a simple inspecting method which makes use of a personal computer. In the present method, the personal computer 119 may simply have the predetermined key code 120 thereinside. Namely, the personal computer 119 enciphers the identification number 116 read from the semiconductor chip 111 by the key code 120 to produce an encrypted code. Subsequently, the encrypted code is checked against the encrypted code 117 read from the semiconductor chip 111. If they coincide with each other from the result of checking, then the semiconductor chip is regarded as non-defective. If they are found not to coincide with each other, then it is regarded as defective. Incidentally, the inspection may be carried out contrary to the above by decompressing the encrypted code 117 read from the semiconductor chip 111 by a decompression key code and checking an post-decompression identification number against the identification number 116 read from the semiconductor chip 111.

The personal computer 119 needs not hold a large quantity of identification number data. It is also possible to inspect or test a semiconductor chip having an identification number according to simple software and hardware (personal computer 119). The more the ciphering method is complete, the more making it easy to perfectly distinguish between a non-defective product and a defective product of each semiconductor chip having the identification number.

According to the present embodiment, a method of economically inspecting a semiconductor device having an identification number can be provided or offered without having to use the conventional expensive semiconductor tester.

Incidentally, the provision of test terminals connected to a main circuit on the surface of the semiconductor chip 111 and the supply of power and test signals through the test terminals make it possible to test or inspect the operations of respective circuits in the semiconductor chip 111.

Since an ultra-compact semiconductor device having an identification number, which is capable of being manufactured at low cost, is implemented according to the present invention as described above, the semiconductor device having the identification number, according to the present invention is intended for applications to a wide range of fields to an IC card, a luggage tag, various keys, wireless door lock, a passcard, a ticket, a commutation ticket, etc. as well as for the above applications, and is applicable to whole articles with barcodes attached thereto.

According to the present invention, a method of economically designing each semiconductor chip having an identification number can be provided. Namely, an electron-beam writing method is used to individually write different identification numbers into their corresponding semiconductor chips on a wafer, each having an identification number as a memory. However, if contact holes or through holes provided between wirings are selectively defined as in the present invention, it is then possible to draw or image patterns for identification numbers without the need for the conventional complex proximity effect correction. Thus, an expensive electron-beam writing device can efficiently be utilized, and a method of economically implementing a semiconductor chip having an identification number can be offered.

Next, according to the present invention, the size of a plane surface of a semiconductor chip is set smaller than the thickness of a standard thickness-type wafer. Further, the wafer is background to thereby set the plane size of the semiconductor chip larger than the thickness of the ground wafer. Thus, when such a semiconductor chip having an identification number is placed on a film-shaped thin mounting base substrate, it can efficiently be placed thereon so as to avoid the vertical placement of a device surface on the mounting base substrate, thus making it possible to provide a method of economically implementing the semiconductor device.

Further, the same data as a barcode is incorporated in part of a memory lying in the semiconductor chip having the identification number. Consequently, it can be handled coexistently with the conventional barcode system, and hence the system can efficiently be operated. Thus, a method of economically applying the semiconductor chip having the identification number can be provided.

Furthermore, according to the present invention, when the semiconductor chip having the identification number is inspected, an encrypted code indicative of an identification number stored in the memory lying within the semiconductor chip having the identification number is used. Consequently, there is provided a proposal for allowing the provision of a method of executing inspections without having to use the conventional expensive semiconductor tester. It is thus possible to economically inspect the semiconductor chip having the identification number.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device having a transmitting and receiving circuit wherein an identification number is configured by a 128-bit memory using a plurality of transistors, comprising the steps:

a step for forming conductive regions which serve as components of the transistors, on a surface of a semiconductor substrate in plural form;

a step for forming an insulating film over a plurality of the conductive regions;

a step for selectively defining contact holes in the insulating film formed on the plurality of conductive regions by an electron-beam writing method to obtain the identification number; and a step for forming wirings connected to the conductive regions through the contact holes respectively.

2. A method of manufacturing a semiconductor device having a transmitting and receiving circuit wherein an identification number is identified by a memory using a plurality of transistors, comprising the steps:

a step for forming source and drain regions of a plurality of the transistors on a surface of a semiconductor substrate;

a step for forming an insulating film so as to cover a plurality of the source and drain regions;

a step for defining contact holes whose presence or absence are selected according to '1' and '0' stored in the memory, in the insulating film on the transistors by using an electron-beam writing method;

a step for forming a wiring layer on the insulating film having the contact holes; and a step for thereafter forming a coil for the reception of a microwave on the semiconductor substrate.

3. The method according to claim 2, wherein the transistors are NMOS transistors.

4. The method according to claim 2, wherein the memory is a read-only memory.

5. The method according to claim 2, wherein the semiconductor device includes counters and a decoder for reading the contents of the memory.

6. The method according to claim 2, wherein the coil is formed for each semiconductor chip by being separated from the semiconductor substrate.

7. A method of manufacturing a semiconductor device wherein an identification number is identified by a memory using a plurality of transistors, comprising the steps:

a step for forming source and drain regions of a plurality of the transistors on a surface of a semiconductor substrate;

a step for forming an insulating film so as to cover a plurality of the source and drain regions;

a step for defining contact holes whose presence or absence are selected according to '1' and '0' stored in the memory, in the insulating film on the transistors by using an electron-beam writing method;

a step for forming a wiring layer on the insulating film having the contact holes; and a step for thereafter forming a coil for the reception of a microwave on the semiconductor substrate, wherein the coil is formed for each semiconductor chip by being separated from the semiconductor substrate, and wherein a plane long-side size of the semiconductor chip is not more than 0.5 mm.

8. A method of manufacturing a semiconductor device wherein an identification number is identified by a memory using a plurality of transistors, comprising the steps:

a step for forming source and drain regions of a plurality of the transistors on a surface of a semiconductor substrate;

a step for forming an insulating film so as to cover a plurality of the source and drain regions;

a step for defining contact holes whose presence or absence are selected according to '1' and '0' stored in the memory, in the insulating film on the transistors by using an electron-beam writing method;

a step for forming a wiring layer on the insulating film having the contact holes; and a step for thereafter forming a coil for the reception of a microwave on the semiconductor substrate, wherein the coil is formed of a metal selected from the group consisting of aluminum and copper.

9. The method according to claim 2, wherein the coil has a multilayer interconnection structure.

10. A method of manufacturing a semiconductor device wherein an identification number is identified by a memory using a plurality of transistors, comprising the steps:

a step for forming source and drain regions of a plurality of the transistors on a surface of a semiconductor substrate;

a step for forming an insulating film so as to cover a plurality of the source and drain regions;

a step for defining contact holes whose presence or absence are selected according to '1' and '0' stored in the memory, in the insulating film on the transistors by using an electron-beam writing method;

a step for forming a wiring layer on the insulating film having the contact holes; and a step for thereafter forming a coil for the reception of a microwave on the semiconductor substrate, wherein the semiconductor device includes a resonance circuit having a capacitor and the coil, and the capacitor is formed with the wiring layer as one electrode.

11. The method according to claim 7, wherein the plane long-side size of the chip is smaller than the thickness of the semiconductor substrate at the start of its manufacture.

12. A method of manufacturing a semiconductor device having a transmitting and receiving circuit wherein an identification number is identified by a memory using a plurality of transistors, comprising the steps:

a step for preparing a semiconductor substrate;

a step for forming the semiconductor device inside a chip area which corresponds to a surface of the semiconductor substrate and whose plane long-side size is smaller than the thickness of the semiconductor substrate;

a step for removing the semiconductor substrate from the back side until the thickness of the semiconductor substrate becomes thinner than the plane long-side size of the chip area; and a step for separating the semiconductor device in chip form.

13. A method of manufacturing a semiconductor device having a transmitting and receiving circuit wherein an identification number is identified by a memory using a plurality of transistors, comprising the steps:

a step for forming conductive regions which serve as components of the transistor, on a surface of a semiconductor substrate in plural form;

a step for forming an insulating film over a plurality of the conductive regions;

a step for selectively defining contact holes in the insulating film formed on the plurality of conductive regions by an electron-beam writing method to obtain the identification number;

a step for forming wirings connected to the conductive regions through the contact holes respectively;

a step for thereafter forming a coil for the reception of a microwave on the semiconductor substrate;

a step for removing the semiconductor substrate from the back side and thinning the same; and a step for separating the semiconductor substrate in the form of a chip;

wherein a plane long-side size of the chip is smaller than the thickness of the semiconductor substrate prior to the start of its manufacture and is larger than the thickness of the thinned semiconductor substrate.

14. A method of manufacturing an electronic device loaded with a semiconductor device wherein an identification number is configured by a memory using a plurality of transistors, comprising the steps:

a step for forming conductive regions which serve as components of the transistor, on the surface of a semiconductor substrate in plural form;

a step for forming an insulating film over a plurality of the conductive regions;

a step for selectively defining contact holes in the insulating film formed on the plurality of conductive regions by an electron-beam writing method to obtain the identification number;

a step for forming wirings connected to the conductive regions through the contact holes respectively; and a step for thereafter fixing a tape to the semiconductor device and inspecting electrical characteristics thereof by using test terminals provided at the semiconductor device.

15. A method of manufacturing an electric device loaded with a semiconductor device wherein an identification number is configured by a 128-bit memory using a plurality of transistors, comprising the steps:

a step for forming conductive regions which serve as components of the transistors, on a surface of a semiconductor substrate in plural form;

a step for forming an insulating film over a plurality of the conductive regions;

a step for selectively defining contact holes in the insulating film formed on the plurality of conductive regions by an electron-beam writing method to obtain the identification number;

a step for forming wirings connected to the conductive regions through the contact holes respectively;

a step for placing the semiconductor device on a mounting base substrate; and a step for bonding the mounting base substrate onto a tape and encapsulating the same in an inlet.

16. A method of manufacturing an electronic device loaded with a semiconductor device wherein an identification number is configured by a first memory using a plurality of transistors, comprising the steps:

a step for forming conductive regions which serve as components of the transistor, on a surface of a semiconductor substrate in plural form;

a step for forming an insulating film over a plurality of the conductive regions;

a step for selectively defining contact holes in the insulating film formed on the plurality of conductive regions by an electron-beam writing method to obtain the identification number and an encrypted code obtained by enciphering the identification number, which is configured by a second memory using a plurality of transistors;

a step for forming wirings connected to the conductive regions through the contact holes respectively; and a step for reading the identification number from the first memory, and collating an encrypted code obtained by enciphering the read identification number according to a procedure similar to said enciphering with an encrypted code read from the second memory, and selecting the semiconductor device as a non-defective product when they coincide with each other and selecting the same as a defective product when they are inconsistent with each other.

17. A method of manufacturing an electronic device loaded with a semiconductor device wherein an identification number is configured by a memory using a plurality of transistors and a plane long-side size thereof is less than or equal to 0.5 mm, comprising the steps:

a step for forming conductive regions which serve as components of the transistor, on a surface of a semiconductor substrate in plural form;

a step for forming an insulating film over a plurality of the conductive regions;

a step for selectively defining contact holes in the insulating film formed on the plurality of conductive regions by an electron-beam writing method to obtain the identification number;

a step for forming wirings connected to the conductive regions through the contact holes respectively; and a step for thereafter dropping the semiconductor device onto paper.

18. A method of manufacturing a semiconductor device having a transmitting and receiving circuit wherein an identification number is configured by a 128-bit memory using a plurality of transistors, comprising the steps:

a step for forming, in plural form, conductive regions which serve as components of a transistor, inside an area which corresponds to a surface of a semiconductor substrate and serves as a semiconductor chip whose plane long-side size is 0.5 mm or less;

a step for forming an insulating film over a plurality of the conductive regions;

a step for selectively defining contact holes in the insulating film by an electron-beam writing method to form a memory for configuring an identification number using 128 bits; and a step for forming wirings connected to the conductive regions through the contact holes on the insulating film, wherein said selectively contact hole defining step is executed continuously together with a step for defining contact holes employed in a peripheral circuit.

19. A method of manufacturing a semiconductor device having a transmitting and receiving circuit wherein an identification number is configured by a 128-bit memory using a plurality of transistors, comprising the steps:

a step for forming conductive regions which serve as components of a transistor, on a surface of a semiconductor device in plural form;

a step for forming a first insulating film over a plurality of the conductive regions;

a step for forming a first wiring connected to the conductive regions on the first insulating film;

a step for forming a second insulating film on a surface including the first wiring;

a step for selectively defining through holes in the second insulating film by an electron-beam writing method to form a memory for configuring an identification number using 128 bits; and a step for forming a second wiring connected to the first wiring through the through holes on the second insulating film.

20. A method of manufacturing a semiconductor device having a transmitting and receiving circuit, comprising the steps:

a step for preparing a semiconductor substrate;

a step for forming a semiconductor device inside a chip area which corresponds to a surface of the semiconductor substrate and whose plane long-side size is smaller than the thickness of the semiconductor substrate;

a step for removing the semiconductor substrate from the back side until the thickness of the semiconductor substrate becomes thinner than the plane long-side size of the chip area; and a step for separating the semiconductor device in chip form;

wherein the semiconductor device is provided with a memory for configuring an identification number.

21. A method of manufacturing a semiconductor device, comprising the steps:

a step for forming a first memory for storing an identification number code used for identifying an identification number, and a second memory for storing an encrypted code obtained by enciphering the identification number;

a step for receiving a microwave and transmitting the identification number and the encrypted code; and a step for collating a second encrypted code obtained by enciphering the identification number read through the microwave according to a procedure similar to said enciphering with a first encrypted code read through the microwave to thereby perform an inspection.

* * * * *